United States Patent [19]

Gary

[11] Patent Number: 4,639,665
[45] Date of Patent: Jan. 27, 1987

[54] SENSING SYSTEM FOR MEASURING A PARAMETER

[75] Inventor: James R. Gary, Elk Grove Village, Ill.

[73] Assignee: Borg-Warner Corporation, Chicago, Ill.

[21] Appl. No.: 525,520

[22] Filed: Aug. 22, 1983

[51] Int. Cl.$^4$ .................. G01R 33/00; G01R 19/00
[52] U.S. Cl. .................. 324/117 H; 324/99 R; 324/207; 324/251
[58] Field of Search .................. 324/117 H, 127, 251, 324/99 R, 207; 307/309

[56] References Cited

U.S. PATENT DOCUMENTS 2,996,670  8/1961  Simonton ........................ 324/99 R
3,573,616  4/1971  Kahen ............................ 324/117

OTHER PUBLICATIONS

Data Sheet for Non-Contact DC and AC Current Sensors (ID-5000 M Series) made by F. W. Bell, Inc., Oct., 1978.

Data Sheet for LA 200-S TransfoSHUNT made by LEM, Geneva, Switzerland, Oct., 1977.

Primary Examiner—Ernest F. Karlsen
Attorney, Agent, or Firm—James E. Tracy

[57] ABSTRACT

A parameter, such as the current flowing through a conductor, is measured by initially passing an energizing magnetic flux through a hall element to produce a hall voltage proportional to the sensed parameter. To eliminate temperature, aging and non-linear effects normally associated with a hall element, the amplitude of the hall voltage is effectively ignored and only its polarity is detected and employed to control the operation of an integrator to develop a cancelling current to establish an equal, but opposite direction, cancelling flux in the hall element. With a zero net flux, the integrator will hold the cancelling current at the level required to balance out and cancel the initial energizing flux. Since the cancelling current needed to null the energizing flux will be proportional to that flux, the current may be used to produce a control voltage to represent the measured parameter.

13 Claims, 3 Drawing Figures

FIG. 1
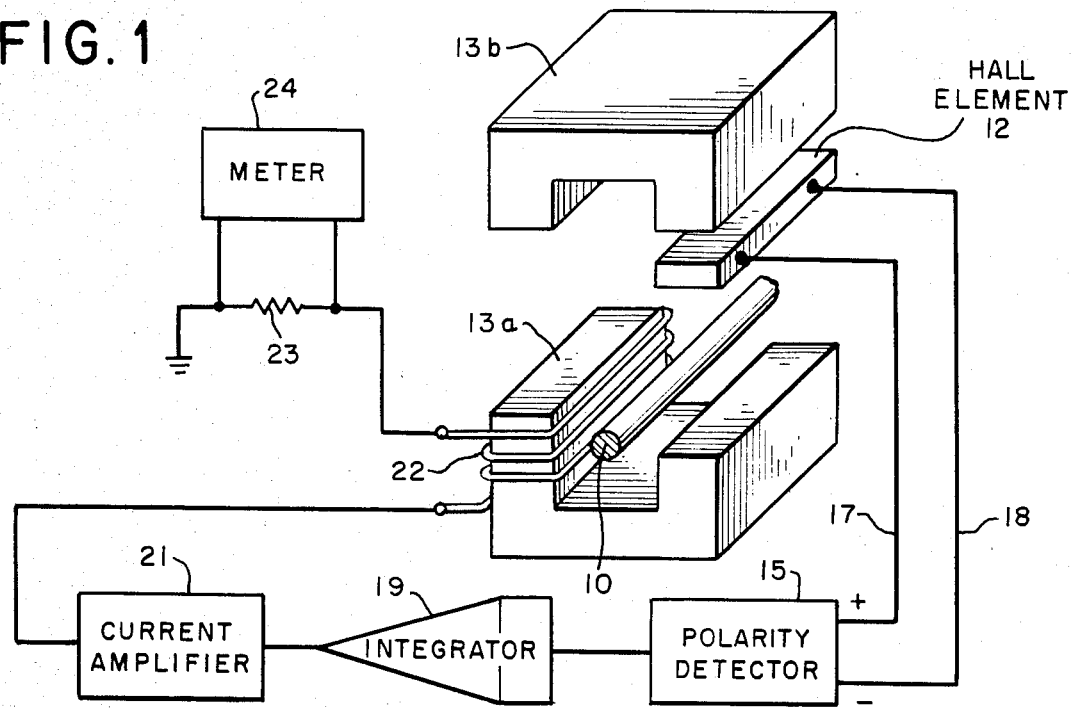
FIG. 2
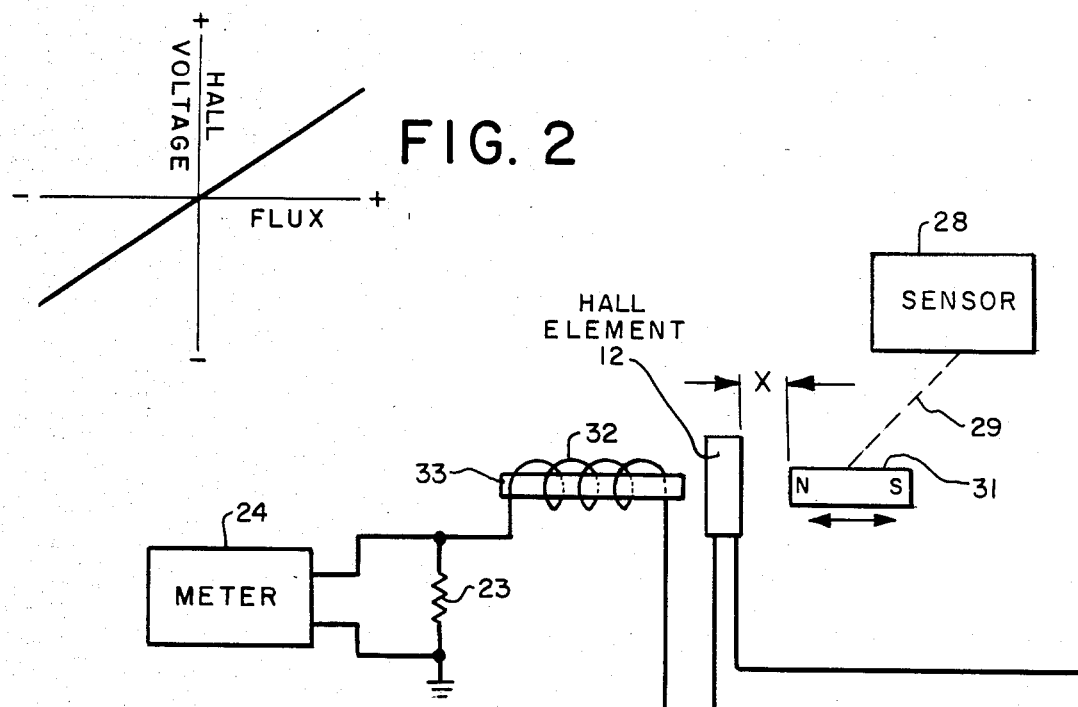
FIG. 3

SENSING SYSTEM FOR MEASURING A PARAMETER

BACKGROUND OF THE INVENTION

This invention relates to a measuring instrument, employing a hall element, for determining the value of a wide variety of parameters in a system. It is particularly useful in measuring electrical current of any waveshape, including d-c, a-c or d-c with superimposed a-c.

Current sensors have been developed wherein a hall element (or hall effect generator) responds to the magnetic flux, produced by the current to be measured, to provide a voltage which is proportional to and represents the current. A major advantage of a hall effect sensor is that it may be clamped on the conductor carrying the measured current and will be electrically isolated from that conductor. In one particular type of sensor, the hall element is subjected to two opposing magnetic fluxes, one produced by the current in the conductor to be measured and the other by a cancellation circuit. The current in the cancellation circuit is adjusted so that the two fluxes cancel each other, the net flux in the hall element thereby becoming zero. The amplitude of the cancelling current is therefore a function of, and provides a measure of, the magnitude of the sensed current.

Unfortunately, the accuracy of these prior hall element sensors suffers with temperature changes and aging. As a hall element ages or its temperature varies, its performance characteristics change and may even become non-linear. Hence, erroneous measurements may be obtained under those conditions. In contrast, the sensing system of the present invention, although also employing a hall element, achieves highly accurate measurements and is immune to the deleterious effects of temperature, aging and non-linearity. Moreover, these improved results are accomplished by means of a relatively simple and inexpensive circuit arrangement utilizing a low-cost hall element.

SUMMARY OF THE INVENTION

The sensing system of the invention comprises a hall element and means for establishing, in the hall element, a first or energizing magnetic flux having a magnitude which is a function of a parameter, such as the current passing through a conductor, to be measured. The resulting hall voltage, produced by the hall element, will have a polarity and an amplitude determined by the first magnetic flux. A polarity detector, coupled to the hall element, develops an output voltage of a polarity determined by that of the hall voltage. The integral of that output voltage controls a cancelling means to establish, in the hall element, a second or cancelling magnetic flux of equal magnitude but of opposite direction relative to the first or energizing magnetic flux, the net flux in the hall element, and the resulting hall voltage, thereby tending to become zero. Means, included in the cancelling means, produce a control voltage which is proportional to and represents the measured parameter. By effectively operating the cancelling means in response to only the polarity of the hall voltage, the sensing system will be immune to any changes in the amplitude of the hall voltage caused by aging, temperature variations or non-linear effects in the hall element.

DESCRIPTION OF THE DRAWING

The features of the invention which are believed to be novel are set forth with particularity in the appended claims. The invention may best be understood, however, by reference to the following description in conjunction with the accompanying drawing in which:

FIG. 1 schematically illustrates a sensing system, constructed in accordance with one embodiment of the invention, for measuring a parameter in a system, specifically the current flowing through a conductor;

FIG. 2 shows the relationship between the magnetic flux and the resultant hall voltage in the hall element included in FIG. 1; and FIG. 3 discloses another embodiment of the invention, the sensing system measuring a parameter or variable, such as pressure, which effects movement of an actuator.

DESCRIPTION OF THE ILLUSTRATED EMBODIMENTS

Referring to FIG. 1, conductor 10 carries the current to be measured, and this current may be d-c flowing in either direction, a-c or a-c with a d-c offset. It may have any amplitude from a few amperes to hundreds of amperes and may have any waveshape and frequency from d-c to greater than 10 kilohertz. Hall element 12 is located in the air gap of the magnetic core formed by the two portions 13a and 13b, which are shown by an exploded view in FIG. 1. With this arrangement, the magnetic core 13a, 13b may be clamped on or over conductor 10 to measure its current without requiring disconnecting of the conductor from the circuit in which it is coupled. Moreover, this permits the current sensor to be electrically isolated from conductor 10. Of course, the diameter of conductor 10 and the physical dimensions of the magnetic core will depend on the magnitude of the current carried by the conductor.

With the core 13a, 13b surrounding or encompassing conductor 10, most of the magnetic flux, created by the current flowing through the conductor, will be concentrated within the core and directed to the hall element 12. As is well understood, a hall element, or hall effect generator, develops a voltage (called a hall voltage) having a polarity and an amplitude which are functions of the flux passing through the hall element, the polarity of the hall voltage being determined by the flux direction (hence the direction of current flow in conductor 10) while the amplitude of the hall voltage is directly proportional to the magnitude or density of the flux, and thus to the amplitude of the current in the conductor. This relationship is shown in FIG. 2. It should be realized that the magnetic core 13a, 13b is not essential. All that is necessary is for the current in conductor 10 to establish, in the hall element 12, a magnetic flux having a strength which is a function of that current. Utilizing a core will contain the flux so that for a given current more flux will pass through the hall element.

Unfortunately, the performance of a hall element is greatly affected by temperature and age. As a hall element ages or its temperature changes, the ratio of voltage to magnetic flux changes, and this changes the slope of the performance line or curve in FIG. 2. Furthermore, the line may even become non-linear. Such variations in performance of hall elements have resulted in inaccurate current measurements in the past. In accordance with a salient feature of the invention, only the polarity of the hall voltage is used and not the magnitude. This makes the current sensing system of FIG. 1 relatively free from temperature, age and non-linear effects. Lower cost and even non-linear hall elements may thus be employed since the hall voltage magnitude has no meaning in the invention.

This important feature is implemented by applying the hall voltage to polarity or sign detector 15 over conductors 17 and 18. Unless the hall voltage is zero, the polarity detector produces an output voltage of fixed or constant magnitude but of a polarity as determined by the sign of the hall voltage. In other words, if the hall voltage is positive and of any amplitude above zero, the output of the polarity detector 15 will also be positive and of a fixed amplitude. On the other hand, any negative voltage whatsoever from the hall element results in a negative output voltage of a fixed value from polarity detector 15. Thus, if current flows through conductor 10 in one direction the output of the polarity detector will be positive, whereas if current flows through the conductor in the other direction the detector output will be negative. Since the magnitude of the voltage out of the polarity detector 15 is in no way a function of the magnitude of the hall voltage, the polarity detector successfully eliminates all aging, temperature and non-linear effects of the hall element 12.

The output of polarity detector 15 is applied to an integrator 19 which integrates in either a positive direction (ramping up) or a negative direction (ramping down) depending on the sign of the detector output voltage. The signal out of the integrator feeds the current amplifier 21 which boosts the signal from the integrator so there is enough current to drive the winding or coil 22 which is wrapped around the magnetic core 13a, 13b. The function of winding 2 is to produce a cancelling flux of opposite polarity or direction to the energizing flux produced by the current in conductor 10. The cancelling flux produced by coil 22 is proportional to the driving current received from the current amplifier 21 which, in turn, is proportional to the output voltage of integrator 19.

Assume, for example, that d-c current flows through conductor 10 in a direction to create a clockwise energizing flux in the core, and assume that such a flux develops a positive voltage out of detector 15. Integrator 19 continues to integrate in a positive direction, in response to the detector output voltage, to produce an increasing counterclockwise cancelling flux in core 13a, 13b until the net flux in the core becomes zero. At this point, the first or energizing flux produced by the current in conductor 10 and the second, opposite direction cancelling flux produced by the current in winding 22 will be of equal magnitude. The resulting hall voltage thus goes to zero and the output of detector 15 becomes a high frequency oscillation (due to the fact that the sign of zero is indeterminate) whose average value is zero. The average zero value from detector 15 causes the integrator 19 to hold its present value which causes a constant driving current to flow in cancelling coil 22 to produce just enough flux to cancel the flux produced by the current in conductor 10.

The amount of current needed in coil 22 to cancel the energizing flux produced by the current in conductor 10 is dependent on the number of turns on the coil and also the number of turns on conductor 10. Assuming $N_1$ turns for conductor 10, $N_2$ turns on coil 22 and a current $I_1$ in conductor 10, the driving current $I_2$ required in coil 22 is equal to $I_1$ multiplied by the ratio $N_1/N_2$. Hence, if the current $I_1$ to be measured is relatively small an input coil would be wrapped around the core, thereby increasing the sensitivity. Since the driving current $I_2$ also flows through the series-connected current limiting resistor 23, the voltage produced across the resistor will be proportional to and will represent the current to be measured in conductor 10. This voltage constitutes a control voltage that can be sensed by meter 24 to provide an indication or display of the magnitude of the current in conductor 10 or can be used to control logic circuitry or some other system.

Any change in current in conductor 10 causes the hall voltage to have a value other than zero and this in turn causes the integrator to move in a direction which changes the current in winding 22 as necessary to effect zero net flux in core 13a, 13b. For example, if the current in conductor 10 increases, the hall element 12 produces a positive voltage causing the polarity detector 15 to issue a positive voltage. Integrator 19 thereupon resumes integrating in a positive direction (ramping up) and the driving current through winding 22 increases to increase the cancelling flux. This continues until the two fluxes are equal, at which time the hall voltage drops to zero and the loop will once again be stabilized. The increased current in conductor 10 will now be indicated by a higher voltage drop across resistor 23. If the current were to decrease in conductor 10, the flux produced by coil 22 would exceed that created by conductor 10 and the hall voltage would become negative. The output voltage of detector 15 therefore becomes negative and integrator 19 begins to integrate in a negative direction (ramping down), causing the current in coil 22 to decrease to the extent necessary to balance out the two fluxes. The hall voltage thus returns to zero and the lower current in resistor 23 represents the lower current in conductor 10.

It will now be apparent that the current in conductor 10 may change in accordance with any waveform and the sensing system will follow or track the changes, producing a control signal across resistor 23 which is either a reduced-amplitude replica or an amplified replica of the current in conductor 10, depending on the $N_1/N_2$ turns ratio. In other words, the waveforms of the currents through conductor 10 and through resistor 23 will be similar. As mentioned, the current in conductor 10 may be a-c superimposed on d-c. For example, in an inverter-motor system the sensing system may be used to measure the d-c bus current which may also have a high frequency ripple. In actual practice it has been found that the sensing system disclosed herein is capable of measuring currents from d-c to a-c having frequencies greater than 10 kilohertz.

It will be appreciated that the invention is susceptible of many different variations. A variety of different parameters may be measured by modifying the FIG. 1 embodiment. For example, when a sensed parameter, such as pressure, distance, etc., physically moves some device, such as a piston, diaphragm, etc., the movement of the device may be employed to adjust the magnitude of the energizing flux passing through the hall element. Such an embodiment is illustrated in FIG. 3. There, sensor 28 represents some sensing mechanism that moves in response to some parameter, such as to a diaphragm whose position is determined by pressure. Dashed construction line 29 schematically illustrates an actuator that establishes the position of magnet 31 in response to the position of the diaphragm. The magnitude of the energizing flux in the hall element 12 will now be a function of the distance between magnet 31 and the hall element, indicated by X in FIG. 3. As the magnet is moved closer to hall element 12 the flux increases and as the magnet is moved away the flux decreases. The rest of the circuit in FIG. 3 operates in a similar fashion as in FIG. 1. The cancelling coil 32 has a magnetic core 33 which helps to contain and amplify the flux produced by the coil, and this flux is then used to cancel the energizing flux from magnet 31. Detector 15, integrator 19 and current amplifier 21 in FIG. 3 respond to the hall voltage, in the manner discussed previously, to produce the necessary current in winding 32 to nullify the flux developed by magnet 31, thereby maintaining a zero hall voltage. Meter 24 will hence provide a measurement of the parameter sensed by sensor 28.

While particular embodiments of the invention have been shown and described, modifications may be made, and it is intended in the appended claims to cover all such modifications as may fall within the true spirit and scope of the invention.

I claim:

1. A sensing system for measuring a parameter, comprising:
   a hall element;
   means for establishing, in said hall element, a first magnetic flux having a magnitude which is a function of the parameter to be measured,
   said hall element thereby producing a hall voltage having a polarity and an amplitude determined by the first magnetic flux;
   a polarity detector, coupled to said hall element, for developing an output voltage of a polarity determined by that of the hall voltage;
   an integrator for integrating the output voltage of said polarity detector;
   cancelling means for establishing, in said hall element and in response to the integrator output voltage, a second magnetic flux of equal magnitude but of opposite direction relative to the first magnetic flux, the net flux in said hall element, and the resulting hall voltage, thereby tending to become zero;
   and means, included in said cancelling means, for producing a control voltage which is proportional to and represents the measured parameter.

2. A sensing system according to claim 1 and including a meter, operated by said control voltage, for indicating the value of the measured parameter.

3. A sensing system according to claim 1 wherein the output voltage of said polarity detector has a fixed magnitude and the same polarity as said hall voltage when the magnitude of said hall voltage is other than zero.

4. A sensing system according to claim 1 wherein said cancelling means includes a cancelling winding to which driving current is supplied to produce the second magnetic flux, said control voltage being developed in response to the drivng current.

5. A sensing system according to claim 4 wherein the driving current flows through a series-connected current limiting resistor, the voltage across the resistor constituting said control voltage.

6. A sensing system according to claim 1 wherein said cancelling means includes a current amplifier whose input couples to the output of said integrator and whose output supplies current to and drives a cancelling winding to develop the necessary second magnetic flux.

7. A sensing system according to claim 1 wherein both the direction and magnitude of the first magnetic flux are determined by the parameter to be measured.

8. A sensing system according to claim 1 wherein the current flowing through a conductor constitutes the parameter to be measured and produces the first magnetic flux, the magnitude of the flux being determined by the current amplitude while the direction of the flux is determined by the direction in which the current flows through said conductor.

9. A sensing system according to claim 8 wherein a magnetic core, within which said hall element is inserted, encompasses said conductor to contain and concentrate the first magnetic flux and to direct it to said hall element.

10. A sensing system according to claim 9 wherein said cancelling means includes a cancelling winding wrapped around said magnetic core to concentrate the second magnetic flux and direct it to said hall element to oppose the first magnetic flux.

11. A sensing system according to claim 1 wherein a movable actuator, in response to the sensed parameter, effectively adjusts the magnitude of the first magnetic flux passing through said hall element.

12. A sensing system according to claim 11 wherein said actuator varies the position of a magnet in order to adjust the magnitude of the first magnetic flux in said hall element.

13. A sensing system according to claim 12 wherein said cancelling means includes a winding wound on a magnetic core for producing the required second magnetic flux.

* * * * *